(12) United States Patent
Lau (10) Patent No.: US 9,948,293 B1
(45) Date of Patent: Apr. 17, 2018

(54) TRANSMITTER DRIVER CIRCUITS AND METHODS

(71) Applicant: Intel Corporation, Santa Clara, CA (US)

(72) Inventor: Ker Yon Lau, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/346,455

(22) Filed: Nov. 8, 2016

(51) Int. Cl.
*H03K 3/00* (2006.01)
*H03K 17/687* (2006.01)

(52) U.S. Cl.
CPC ..... *H03K 17/6872* (2013.01); *H03K 17/6874* (2013.01)

(58) Field of Classification Search
CPC ............... G11C 5/145; H03K 19/0005; H03K 19/017545; H03K 19/01825; H03K 19/018557; H03K 19/1732; H03K 19/0175; H03K 19/017509–19/018507; H03K 19/082; H03K 19/09418; H03K 19/09448; H03K 19/212; H03K 17/6872; H03K 19/018521; H03K 19/018571; H03K 19/0843; H03K 19/0941; H03K 19/0948; H03K 19/0963; H03K 2005/00228; H03K 3/356104; H03K 3/356; H05K 1/0246; G06F 13/4086

USPC ............................................. 327/108
See application file for complete search history.

(56) References Cited

U.S. PATENT DOCUMENTS

| | | | | |
|---|---|---|---|---|
| 6,812,733 B1* | 11/2004 | Plasterer | .......... | H03K 3/356104 326/115 |
| 2010/0164539 A1* | 7/2010 | Balamurugan | | H03K 19/018585 326/30 |
| 2010/0188058 A1* | 7/2010 | Dimitriu | .................. | G05F 3/08 323/233 |

* cited by examiner

*Primary Examiner* — Patrick Chen
(74) *Attorney, Agent, or Firm* — Steven J. Cahill (57) ABSTRACT

An integrated circuit includes first and second transmitter driver circuits. The first transmitter driver circuit includes a first pull-up circuit and a first pull-down circuit that are configured as a first voltage mode driver to drive a first single-ended output signal to a first pad during a voltage mode operation. The second transmitter driver circuit includes a second pull-up circuit and a second pull-down circuit that are configured as a second voltage mode driver to drive a second single-ended output signal to a second pad during the voltage mode operation. The first and second pull-up circuits and the first and second pull-down circuits drive a differential output signal to the first and second pads during a current mode operation when the first and second transmitter driver circuits are configured as a current mode driver.

20 Claims, 5 Drawing Sheets

TRANSMITTER DRIVER CIRCUITS AND METHODS

FIELD OF THE DISCLOSURE

The present disclosure relates to electronic circuits, and more particularly, to transmitter driver circuits and methods.

BACKGROUND

Figure 1:
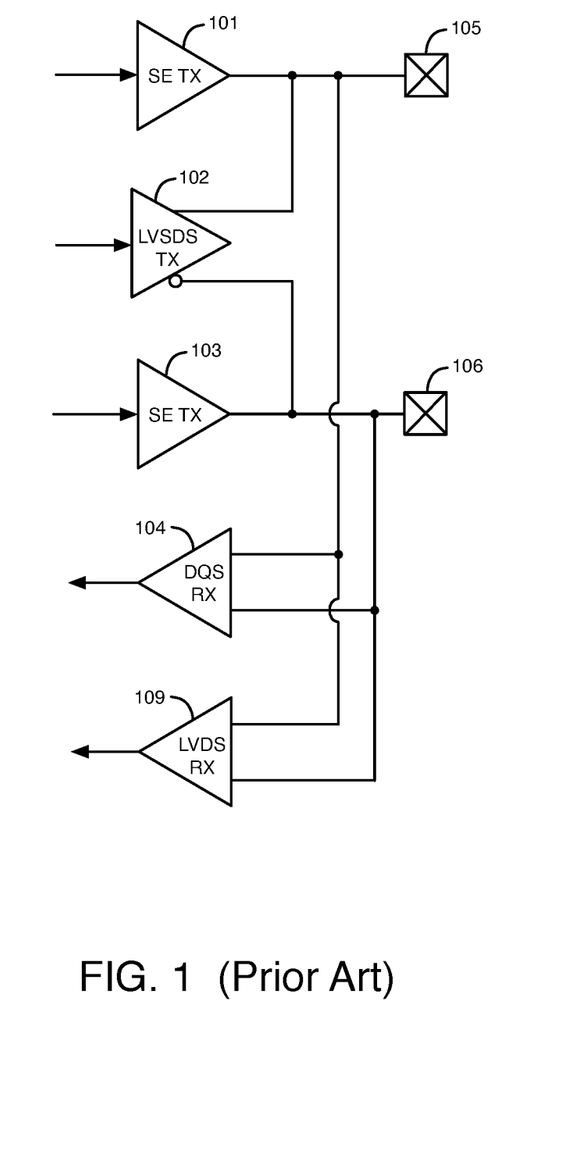
FIG. 1 illustrates an example of a prior art input/output (IO) circuit in an FPGA integrated circuit (IC) that includes five dedicated driver circuits coupled to pads of the IC.

Existing field programmable gate array (FPGA) integrated circuits typically have programmable input/output circuitry that includes dedicated drivers for different input/output standards. FIG. 1 illustrates an example of a prior art input/output (IO) circuit in an FPGA integrated circuit (IC) that includes five dedicated driver circuits 101-104 and 109 coupled to pads 105-106 of the IC. The IO circuit of Figure (FIG.) 1 includes two single-ended (SE) double data rate (DDR) transmitter (TX) driver circuits 101 and 103, a low voltage differential signaling (LVDS) transmitter driver circuit 102, a data strobe (DQS) DDR receiver (RX) driver circuit 104, and an LVDS receiver driver circuit 109.

Figure 2:
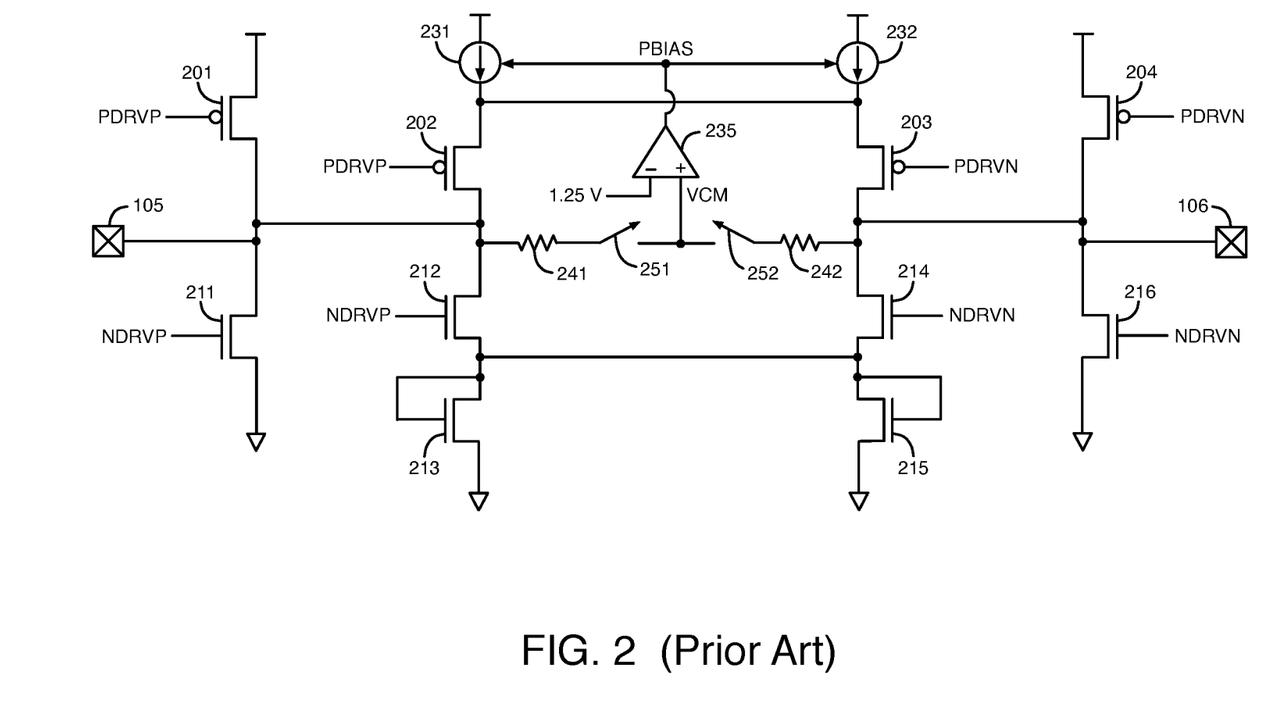
FIG. 2 illustrates further details of the three prior art transmitter driver circuits shown in FIG. 1.

FIG. 2 illustrates further details of the three prior art transmitter driver circuits 101-103 of FIG. 1. FIG. 2 shows p-channel field-effect transistors (PFETs) 201-204, n-channel field-effect transistors (NFETs) 211-216, pads 105-106 of the IC, current sources 231-232, feedback amplifier circuit 235, resistors 241-242, and switch circuits 251-252.

The DDR TX driver circuit 101 includes transistors 201 and 211, and the DDR TX driver circuit 103 includes transistors 204 and 216. When the switch circuits 251-252 are open (i.e., non-conductive), DDR TX driver circuits 101 and 103 function as single-ended voltage mode driver circuits that drive two single-ended signals PDRVP/NDRVP and PDRVN/NDRVN to pads 105 and 106, respectively. Although only one PFET and only one NFET are shown in each of driver circuits 101 and 103 in FIG. 2, each of the driver circuits 101 and 103 has multiple PFETs in parallel and multiple NFETs in parallel that may drive an output signal to the respective pad 105 or 106.

The LVDS TX driver circuit 102 includes PFETs 202-203, NFETs 212-215, current sources 231-232, resistors 241-242, and amplifier circuit 235. When the switch circuits 251-252 are closed (i.e., conductive), the LVDS TX driver circuit 102 functions as a differential current mode driver circuit. Feedback amplifier circuit 235 controls the currents through current sources 231-232 based on the voltage difference between the common mode voltage VCM between switch circuits 251-252 and a constant voltage of 1.25 volts. Driver circuit 102 drives the differential signal PDRVP/NDRVP minus PDRVN/NDRVN to pads 105 and 106. The LVDS and DDR driver circuits 101-103 have separate programmable current and drive strength for different platform requirements.

BRIEF SUMMARY

According to some embodiments disclosed herein, an integrated circuit includes first and second transmitter driver circuits. The first transmitter driver circuit includes a first pull-up circuit and a first pull-down circuit that are configured as a first voltage mode driver to drive a first single-ended output signal to a first pad during a voltage mode operation. The second transmitter driver circuit includes a second pull-up circuit and a second pull-down circuit that are configured as a second voltage mode driver to drive a second single-ended output signal to a second pad during the voltage mode operation. The first and second pull-up circuits and the first and second pull-down circuits drive a differential output signal to the first and second pads during a current mode operation when the first and second transmitter driver circuits are configured as a current mode driver.

Embodiments of the present invention can be implemented in numerous ways, such as a process, an apparatus, a system, or a device. Various objects, features, and advantages of the present invention will become apparent upon consideration of the following detailed description and the accompanying drawings.

DETAILED DESCRIPTION

Because the prior art input/output (IO) circuit of FIG. 1 has 5 separate dedicated driver circuits, the IO circuit of FIG. 1 consumes a significant amount of power and has a high capacitance at pads 105-106. The high pad capacitance tends to degrade signal integrity and reduce IO signal performance. Therefore, it would be desirable to provide IO circuitry that has a lower pad capacitance and that consumes less power than the IO circuit of FIG. 1.

According to an embodiment disclosed herein, an input/output (IO) circuit includes two transmitter driver circuits that are used to drive single-ended and differential output signals to two pads of an integrated circuit. The two driver circuits may be configured as voltage mode drivers that drive single-ended signals to the pads of the integrated circuit. The two driver circuits may also be configured as a single current mode driver that drives a differential signal to the pads of the integrated circuit. The two driver circuits may also be configured in a termination mode to provide termination resistance at the pads for input signals that are received at the pads and buffered by a receiver driver circuit. Because the IO circuit of this embodiment uses less driver circuits compared to the prior art IO circuit of FIG. 1, the IO circuit of this embodiment has a lower pad capacitance, consumes less power, and uses less die area than the IO circuit of FIG. 1.

In the following description, for the purpose of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention. Several features are described hereafter that can each be used independently of one another or with any combination of other features.

Figure 3:
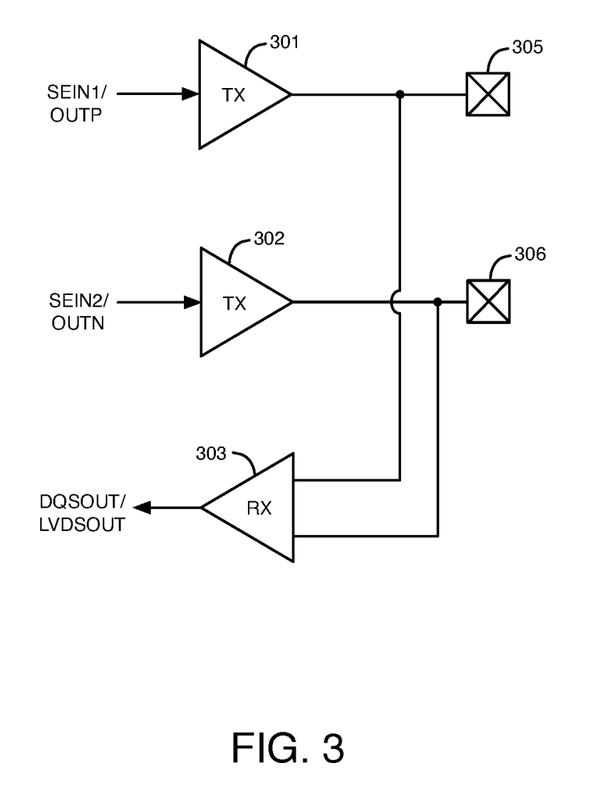
FIG. 3 illustrates an example of an input/output (IO) circuit that includes two transmitter (TX) driver circuits and a receiver (RX) driver circuit, according to an embodiment of the present invention.

FIG. 3 illustrates an example of an input/output (IO) circuit that includes two transmitter (TX) driver circuits 301-302 and a receiver (RX) driver circuit 303, according to an embodiment of the present invention. The IO circuit of FIG. 3 is in an integrated circuit. The IO circuit of FIG. 3 may be in any type of integrated circuit (IC), such as an FPGA, a programmable logic device, a microprocessor, a graphics processing unit (GPU), or a memory IC. The outputs of driver circuits 301 and 302 are coupled to pads 305 and 306, respectively, of the integrated circuit. The inputs of driver circuit 303 are coupled to pads 305-306.

Driver circuits 301 and 302 may be configured as voltage mode drivers that drive single-ended signals SEIN1 and SEIN2 from circuitry within the IC to pads 305-306, respectively, during a voltage mode operation. Driver circuits 301 and 302 may also be configured as a single current mode driver that drives differential signal OUTP-OUTN from circuitry within the IC to pads 305-306 during a current mode operation. Differential signal OUTP-OUTN may be, for example, an LVDS differential signal.

Driver circuit 303 may be configured as an input buffer that drives a differential input signal received at pads 305-306 from a source outside the integrated circuit to circuits within the integrated circuit. In one mode of operation, driver circuit 303 may drive an LVDS differential signal from pads 305-306 to its output as signal LVDSOUT. In another mode of operation, driver circuit 303 may drive a differential data strobe signal from pads 305-306 to its output as signal DQSOUT. The LVDS and data strobe signals received at pads 305-306 may be differential signals that have different common mode voltages. Receiver driver circuit 303 can perform the same signal receiving functions as the two receiver driver circuits 104 and 109 of FIG. 1. Using one receiver driver circuit 303 instead of two receiver driver circuits 104 and 109 reduces IC die area usage and power consumption.

While driver circuit 303 is configured to drive input signals from pads 305-306 to circuits within the integrated circuit, driver circuits 301-302 may be configured in a termination mode to provide termination resistance at the pads 305-306, as described in further detail below with respect to FIG. 4.

Figure 4:
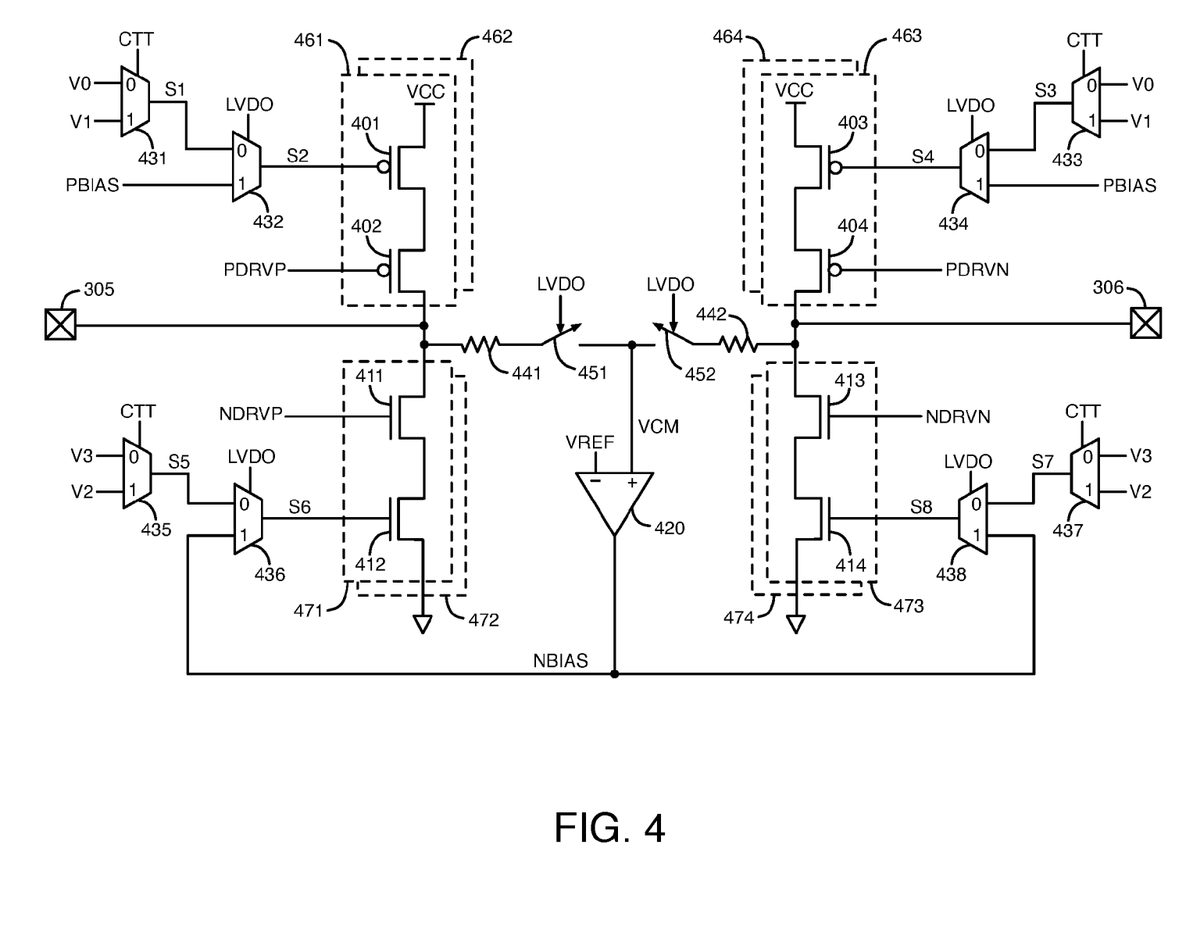
FIG. 4 illustrates more detailed examples of the transmitter driver circuits of FIG. 3, according to an embodiment of the present invention.

FIG. 4 illustrates more detailed examples of transmitter driver circuits 301-302 of FIG. 3, according to an embodiment of the present invention. The embodiment of FIG. 4 includes two transmitter driver circuits that can drive single-ended output signals when configured as voltage mode drivers during a voltage mode operation. The two transmitter driver circuits can also drive a differential signal when configured as a single current mode driver during a current mode operation. The transmitter driver circuits of FIG. 4 may be configured in a termination mode to provide termination resistance at the pads 305-306 for input signals that are received at the pads and buffered by receiver driver circuit 303, as described in further detail below. Because the IO circuit of FIG. 4 uses only two transmitter driver circuits compared to the three transmitter driver circuits 101-103 of FIG. 1 to provide single-ended and differential signal transmission, the IO circuit of FIG. 4 has a lower pad capacitance, consumes less power, and uses less die area than the IO circuit of FIG. 1.

FIG. 4 shows pull-up circuits 461-464, pull-down circuits 471-474, analog multiplexer circuits 431-438, resistors 441-442, switch circuits 451-452, feedback amplifier circuit 420, and pads 305-306 of the IC. The first transmitter driver circuit of FIG. 4 includes pull-up circuits 461-462 and pull-down circuits 471-472. The second transmitter driver circuit of FIG. 4 includes pull-up circuits 463-464 and pull-down circuits 473-474.

Each of the pull-up circuits 461-462 includes two p-channel field-effect transistors (PFETs) 401-402 that are coupled in series between a node at a supply voltage VCC and pad 305. Each of the pull-down circuits 471-472 includes two n-channel field-effect transistors (NFETs) 411-412 that are coupled in series between pad 305 and a node at a ground voltage. Each of the pull-up circuits 463-464 includes two PFETs 403-404 that are coupled in series between the node at supply voltage VCC and pad 306. Each of the pull-down circuits 473-474 includes two NFETs 413-414 that are coupled in series between pad 306 and the node at the ground voltage. The stacked configuration of the two transistors coupled in series in each of circuits 461-464 and 471-474 reduces power density and local temperature effect (LTE) hot-spots in the IC.

The term "coupled" as used herein includes circuits that are connected together through other circuits, as long as a current path can flow between the coupled circuits. The term "directly connected" refers to circuits that are in direct contact with each other (e.g., transistors 402 and 411 are shown in FIG. 4 as directly connected to pad 305).

Each pull-up circuit and its corresponding pull-down circuit that are coupled to the same pad are referred to as a unit slice circuit. For example, pull-up circuit 461 and pull-down circuit 471 are one unit slice circuit. Pull-up circuit 463 and pull-down circuit 473 are another unit slice circuit. Each of the two transmitter driver circuits of FIG. 4 may have any number of unit slice circuits coupled to its respective pad 305 or 306. Only two pull-up circuits and two pull-down circuits (i.e., two unit slice circuits) are shown for each driver circuit in FIG. 4 merely as an example. The unit slice circuits may be selectively enabled and disabled to vary the drive strength of the output signals and the termination resistance provided to pads 305-306 for different IO standards and/or platform requirements.

A control signal LVDO is provided to a control input of each of switch circuits 451-452. Control signal LVDO controls the conductive states of switch circuits 451-452. As mentioned above, the transmitter driver circuits of FIG. 4 may be configured as voltage mode drivers or as a current mode driver. When the transmitter driver circuits of FIG. 4 drive single-ended signals to pads 305-306 as voltage mode drivers during a voltage mode operation, control signal LVDO is driven to a logic low state. In response to signal LVDO being in a logic low state, switch circuits 451-452 are open. When switch circuits 451-452 are open, switch circuits 451-452 do not conduct current, and amplifier circuit 420 is decoupled from the feedback loop circuits in FIG. 4.

Control signal CTT controls analog multiplexer circuits 431, 433, 435, and 437. Control signal LVDO also controls analog multiplexer circuits 432, 434, 436, and 438. Analog multiplexer circuits 431-438 may be, for example, pass gate circuits that each include one or more pass transistors. During the voltage mode operation, each of the control signals CTT and LVDO is driven to a logic low state (i.e., representing a 0 value). In response to control signal CTT being in a logic low state, multiplexer circuits 431, 433, 435, and 437 provide the voltage at their 0 inputs to their outputs as selected voltage signals S1, S3, S5, and S7, respectively. In response to control signal LVDO being in a logic low state, multiplexer circuits 432, 434, 436, and 438 provide signals S1, S3, S5, and S7 at their 0 inputs to their outputs as selected voltage signals S2, S4, S6, and S8, respectively.

Voltage signals S2, S4, S6, and S8 are provided to the gates of transistors 401, 403, 412, and 414 in each of circuits 461-462, 463-464, 471-472, and 473-474, respectively.

Thus, during voltage mode operation, the voltage of signal V0 at the 0 inputs of multiplexer circuits 431 and 433 is provided to the gates of transistors 401 and 403 in each unit slice circuit, and the voltage of signal V3 at the 0 inputs of multiplexer circuits 435 and 437 is provided to the gates of transistors 412 and 414 in each unit slice circuit. In an exemplary embodiment, voltage V0 has a constant voltage of 0 or near 0 volts, and voltage V3 has a constant voltage of 1.8 volts. As a result, when signals CTT and LVDO are in logic low states, each of p-channel transistors 401 and 403 is on in its saturation region in response to V0 (e.g., 0 volts) at its gate, and each of n-channel transistors 412 and 414 is on in its saturation region in response to V3 (e.g., 1.8 volts) at its gate.

Four drive signals PDRVP, NDRVP, PDRVN, and NDRVN are shown in FIG. 4. Signals PDRVP and NDRVP are generated by pre-driver circuitry (not shown) based on a first single-ended output signal to be driven to pad 305 during the voltage mode operation when the driver circuits of FIG. 4 are configured as voltage mode drivers. Signals PDRVN and NDRVN are generated by pre-driver circuitry (not shown) based on a second single-ended output signal to be driven to pad 306 during the voltage mode operation when the driver circuits of FIG. 4 are configured as voltage mode drivers. Signals PDRVP, NDRVP, PDRVN, and NDRVN are provided to the gates of transistors 402, 411, 404, and 413, respectively, in each corresponding unit slice circuit. The IO circuit of FIGS. 3-4 reduces the pre-driver IC die area, because the pre-driver circuitry is shared during voltage mode operation and current mode operation. In FIGS. 1-2, separate pre-driver circuits and separate control signals are used by the 3 transmitter driver circuits.

Signals PDRVP and NDRVP turn transistors 402 and 411, respectively, on and off in each of the enabled unit slice circuits to drive bits indicated by the first single-ended output signal to pad 305 during voltage mode operation. For example, when signals PDRVP and NDRVP are at a high voltage (e.g., at supply voltage VCC) transistor 402 is off, transistor 411 is on, and transistors 411-412 pull the voltage at pad 305 to the ground voltage. When signals PDRVP and NDRVP are at the ground voltage, transistor 411 is off, transistor 402 is on, and transistors 401-402 pull the voltage at pad 305 to the supply voltage VCC.

Signals PDRVN and NDRVN turn transistors 404 and 413, respectively, on and off in each of the enabled unit slice circuits to drive bits indicated by the second single-ended output signal to pad 306 during voltage mode operation. For example, when signals PDRVN and NDRVN are at a high voltage (e.g., at supply voltage VCC) transistor 404 is off, transistor 413 is on, and transistors 413-414 pull the voltage at pad 306 to the ground voltage. When signals PDRVN and NDRVN are at the ground voltage, transistor 413 is off, transistor 404 is on, and transistors 403-404 pull the voltage at pad 306 to the supply voltage VCC.

When the transmitter driver circuits of FIG. 4 drive a differential signal to pads 305-306 as a current mode driver during a current mode operation, control signal LVDO is driven to a logic high state (i.e., representing a 1 value). In response to control signal LVDO being in a logic high state, switch circuits 451-452 are closed. When switch circuits 451-452 are closed, switch circuits 451-452 can conduct current, amplifier circuit 420 is coupled in two feedback loops in FIG. 4, and the transmitter driver circuits of FIG. 4 are coupled together as a single current mode driver circuit.

During the current mode operation, the two transmitter driver circuits of FIG. 4 are coupled together through switch circuits 451-452 and resistors 441-442. Control signal LVDO may be toggled between logic high and low states dynamically using circuitry within the IC (e.g., using configuration bits stored in memory circuits) or in response to external user input to control when the driver circuits are configured as voltage mode drivers or as a current mode driver. Control signal CTT may be in a logic high or low state when the circuitry of FIG. 4 functions as a current mode driver.

In response to control signal LVDO being in a logic high state, multiplexer circuits 432 and 434 provide the voltage of a PBIAS signal at their 1 inputs to their outputs as selected voltage signals S2 and S4, respectively. Signals S2 and S4 are provided to the gates of transistors 401 and 403, respectively. Thus, multiplexer circuits 432 and 434 provide the voltage of PBIAS to the gates of transistors 401 and 403, respectively, during current mode operation. The PBIAS signal has a constant voltage that causes transistors 401 and 403 to conduct current as current source circuits. Transistors 401 and 403 may be fully or partially on during current mode operation. As an example, the PBIAS signal may have a constant voltage that is between 0 and 1.5 volts.

Also, in response to control signal LVDO being in a logic high state, multiplexer circuits 436 and 438 provide the voltage of an NBIAS signal at their 1 inputs to their outputs as selected voltage signals S6 and S8, respectively. Signals S6 and S8 are provided to the gates of transistors 412 and 414, respectively, in each unit slice circuit. Thus, multiplexer circuits 436 and 438 provide the voltage of signal NBIAS to the gates of transistors 412 and 414, respectively, during current mode operation.

During the current mode operation, the non-inverting (+) input of amplifier circuit 420 is coupled to pads 305-306 through switch circuits 451-452 and resistors 441-442, respectively. Resistors 441-442 are selected to have the same resistances. As a result, the non-inverting (+) input of amplifier circuit 420 receives the common mode voltage VCM of the differential output signal generated at pads 305-306 during the current mode operation. A constant reference voltage VREF (e.g., 1.25 volts) is provided to the inverting (−) input of amplifier circuit 420, as shown in FIG. 4. During current mode operation, amplifier circuit 420 amplifies the voltage difference between voltages VCM and VREF based on its voltage gain to generate the voltage of signal NBIAS at its output.

During the current mode operation when switch circuits 451-452 are closed, two feedback loop circuits are formed. The first feedback loop circuit includes amplifier circuit 420, multiplexer circuit 436, circuits 471-472, resistor 441, and switch circuit 451. The second feedback loop circuit includes amplifier circuit 420, multiplexer circuit 438, circuits 473-474, resistor 442, and switch circuit 452. These two feedback loop circuits have an improved electro-static discharge (ESD) performance during current mode operation compared to the circuit of FIG. 2, because the gates of n-channel transistors 412 and 414 are not coupled to pads 305-306. In FIG. 2, the gates of transistors 213 and 215 are coupled to pads 105-106 through transistors 212 and 214, respectively, which can impact the ESD performance.

During the current mode operation, amplifier circuit 420 drives signal NBIAS to a voltage that causes the common mode voltage VCM at its non-inverting (+) input to be equal to or nearly equal to the reference voltage VREF. Amplifier circuit 420 can adjust the currents through circuits 471-474 by adjusting the voltage of signal NBIAS to control the conductive states of transistors 412 and 414 to cause voltage VCM to equal voltage VREF. The feedback loop circuits provide a balanced differential output signal at pads 305-306 during the current mode operation by maintaining the common mode voltage VCM of the differential output signal generated at pads 305-306 at voltage VREF.

Signals PDRVP, NDRVP, PDRVN, and NDRVN are generated by pre-driver circuitry (not shown) based on a differential output signal to be driven to pads 305 and 306 during the current mode operation when the driver circuits of FIG. 4 are configured as a current mode driver. The pre-driver circuitry receives a differential output signal that equals the difference between two signals DRVP and DRVN. The pre-driver circuitry generates signals PDRVP and NDRVP based on signal DRVP. The pre-driver circuitry generates signals PDRVN and NDRVN based on signal DRVN. During the current mode operation, signals PDRVP, NDRVP, PDRVN, and NDRVN turn transistors 402, 411, 404, and 413, respectively, on and off in each of the enabled unit slice circuits to drive bits indicated by the differential output signal DRVP-DRVN to pads 305-306. The differential output signal generated by the current mode driver circuit at pads 305-306 equals the difference between the output voltages at pads 305 and 306. The differential output signal generated at pads 305-306 may be, for example, an LVDS signal.

During the current mode operation, resistors 441-442 provide termination resistance at pads 305-306, respectively, to reduce signal reflection. The resistances of resistors 441-442 may be selected based on the termination resistance required by a particular differential signal standard. For example, the resistances of resistors 441-442 may equal a termination resistance required for the LVDS standard (e.g., 50-60 ohms for each resistor or 100-120 ohms total).

As mentioned above, the driver circuits of FIG. 4 may be configured in a termination mode to provide termination resistance at the pads 305-306 for a differential input signal received at pads 305-306 and buffered by receiver driver circuit 303 (shown in FIG. 3). During the termination mode of operation, control signal CTT is driven to a logic high state, and control signal LVDO is driven to a logic low state. Switch circuits 451-452 are open in response to signal LVDO being in a logic low state during the termination mode of operation to decouple amplifier circuit 420 from the feedback loop circuits. In response to signal CTT being in a logic high state, multiplexer circuits 431, 433, 435, and 437 provide the voltages at their 1 inputs to their outputs as selected voltage signals S1, S3, S5, and S7, respectively. In response to signal LVDO being in a logic low state, multiplexer circuits 432, 434, 436, and 438 provide signals S1, S3, S5, and S7 at their 0 inputs to their outputs as selected voltage signals S2, S4, S6, and S8, respectively.

During the termination mode of operation, the voltage of signal V1 at the 1 inputs of multiplexer circuits 431 and 433 is provided to the gates of transistors 401 and 403, and the voltage of signal V2 at the 1 inputs of multiplexer circuits 435 and 437 is provided to the gates of transistors 412 and 414. In an exemplary embodiment, voltage V1 has a constant voltage of 0.3 volts, and voltage V2 has a constant voltage of 1.5 volts. As a result, during the termination mode of operation, each of p-channel transistors 401 and 403 is on in its triode/linear region in response to V1 at its gate, and each of n-channel transistors 412 and 414 is on in its triode/linear region in response to V2 at its gate. Operating transistors 401, 403, 412, and 414 in their triode/linear regions allows the resistance of these transistors to be set to match a desired termination resistance for each of the unit slice circuits. Voltages V1 and V2 may be, for example, programmable by a resistive or CMOS divider circuit to set and adjust the resistances of transistors 401, 403, 412, and 414.

Also, during the termination mode of operation, the pre-driver circuitry drives signals PDRVP and PDRVN to the ground voltage to turn transistors 402 and 404 on in circuits 461-464, and the pre-driver circuitry drives signals NDRVP and NDRVN to the supply voltage VCC (e.g., 1.8 volts) to turn transistors 411 and 413 on in circuits 471-474. Thus, during the termination mode of operation, current flows from VCC to ground through p-channel and n-channel transistors in each of the unit slice circuits that is enabled and coupled to one of pads 305 or 306. The continuous current flow through the transistors during termination mode may increase power consumption and possibly reduce the usable lifetime of the transistors. Therefore, transistors 401, 403, 412, and 414 are operated in their linear/triode regions as mentioned above to reduce the current and power density in the unit slice circuits, to lower the temperatures of the transistors to avoid hot spots in the IC, and to increase the usable lifetime of the transistors. Biasing transistors 401, 403, 412, and 414 in their triode/linear regions also helps to ensure linearity to achieve signal integrity and eye opening of the differential input signal received at pads 305-306 during termination mode.

During the termination mode of operation, the unit slice circuits, including circuits 461/471, 462/472, 463/473, and 464/474, of the two driver circuits provide termination resistance at the pads 305-306. The number of unit slice circuits that are enabled during termination mode can be selected to set the total termination resistance at each of the pads 305-306 to match the characteristic impedance of the transmission lines coupled to pads 305-306. More of the unit slice circuits can be enabled to decrease the termination resistance at pads 305-306, and more of the unit slice circuits can be disabled to increase the termination resistance at pads 305-306. The number of unit slice circuits that are enabled and disabled can be calibrated by termination impedance calibration circuitry at startup or periodically during circuit operation. The unit slice circuits in the driver circuits of FIG. 4 can provide termination resistance at pads 305-306 according to any interface standard, such as for example, the center tap terminated (CTT), DDR2, or DDR3 interface standards.

Figure 5:
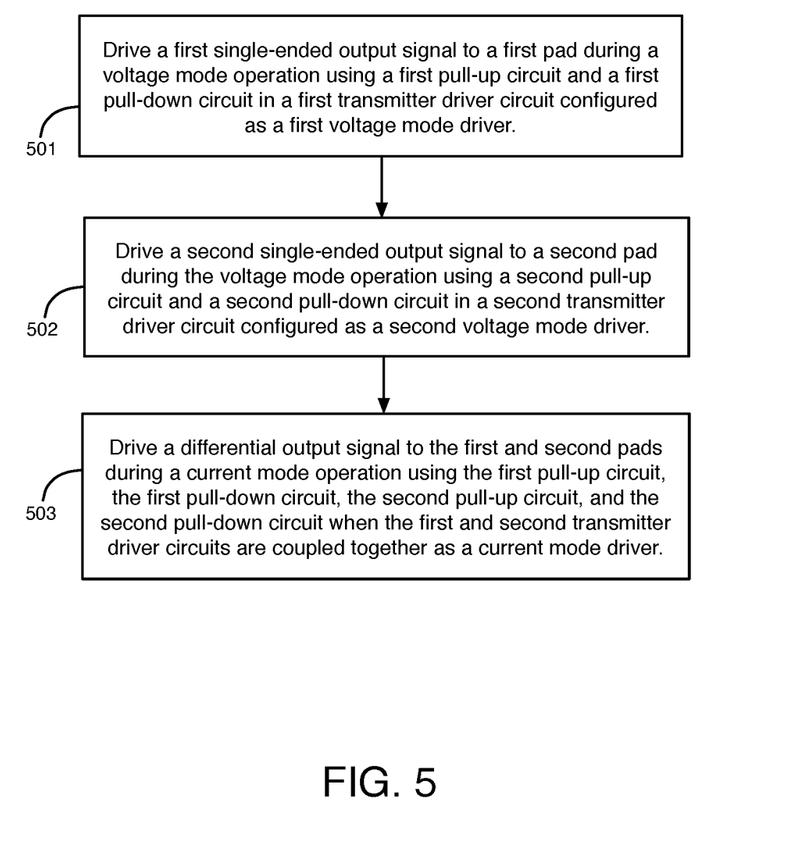
FIG. 5 illustrates examples of operations that may be performed to drive single-ended and differential signals to pads of an integrated circuit using two transmitter driver circuits in the integrated circuit, according to an embodiment of the present invention.

FIG. 5 illustrates examples of operations that may be performed to drive single-ended and differential signals to pads of an integrated circuit using two transmitter driver circuits in the integrated circuit, according to an embodiment of the present invention. The first transmitter driver circuit includes a first pull-up circuit and a first pull-down circuit (e.g., pull-up circuit 461 and pull-down circuit 471 or pull-up circuit 462 and pull-down circuit 472). The second transmitter driver circuit includes a second pull-up circuit and a second pull-down circuit (e.g., pull-up circuit 463 and pull-down circuit 473 or pull-up circuit 464 and pull-down circuit 474). In operation 501, the first pull-up circuit and the first pull-down circuit are configured as a first voltage mode driver to drive a first single-ended output signal to a first pad during a voltage mode operation. In operation 502, the second pull-up circuit and the second pull-down circuit are configured as a second voltage mode driver to drive a second single-ended output signal to a second pad during the voltage mode operation. In operation 503, the first and second pull-up circuits and the first and second pull-down circuits drive a differential output signal to the first and second pads during a current mode operation when the first and second transmitter driver circuits are coupled together as a current mode driver.

The methods and apparatuses described herein may be incorporated into any suitable electronic device or system of electronic devices. For example, the methods and apparatuses may be incorporated into numerous types of devices, such as programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), microprocessors, and graphics processing units (GPUs).

The integrated circuits described herein may be part of a data processing system that includes one or more of the following components; a processor; memory; input/output circuitry; and peripheral devices. The integrated circuits can be used in a wide variety of applications, such as computer networking, data networking, instrumentation, video processing, digital signal processing, or any suitable other application.

Although the method operations were described in a specific order, it should be understood that other operations may be performed in between described operations, described operations may be adjusted so that they occur at slightly different times or in a different order, or described operations may be distributed in a system that allows the occurrence of the operations at various intervals associated with the processing.

The foregoing description of the exemplary embodiments of the present invention has been presented for illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An integrated circuit comprising:
    a first transmitter driver circuit comprising a first pull-up circuit and a first pull-down circuit that are configured as a first voltage mode driver to drive a first single-ended output signal to a first pad during a voltage mode operation;
    a second transmitter driver circuit comprising a second pull-up circuit and a second pull-down circuit that are configured as a second voltage mode driver to drive a second single-ended output signal to a second pad during the voltage mode operation,
    wherein the first and second pull-up circuits and the first and second pull-down circuits drive a differential output signal to the first and second pads during a current mode operation when the first and second transmitter driver circuits are configured as a current mode driver; and
    an amplifier circuit, wherein the amplifier circuit generates an output voltage that is provided to inputs of the first and second pull-down circuits during the current mode operation to control currents through the first and second pull-down circuits.

2. The integrated circuit of claim 1 further comprising:
    a differential receiver driver circuit, wherein the first and second pull-up circuits and the first and second pull-down circuits in the first and second transmitter driver circuits are configured as termination circuits that provide termination resistance at the first and second pads during a termination mode of operation during which the differential receiver driver circuit buffers a differential input signal received at the first and second pads.

3. The integrated circuit of claim 1, wherein the first pull-up circuit comprises first and second transistors coupled in series, the first pull-down circuit comprises third and fourth transistors coupled in series, the second pull-up circuit comprises fifth and sixth transistors coupled in series, and the second pull-down circuit comprises seventh and eighth transistors coupled in series.

4. The integrated circuit of claim 1 further comprising:
    a first resistor coupled to the first pad;
    a second resistor coupled to the second pad;
    a first switch circuit coupled to the first resistor; and
    a second switch circuit coupled to the second resistor,
    wherein an input of the amplifier circuit is coupled to the first and second switch circuits, and wherein the first and second switch circuits are closed during the current mode operation.

5. The integrated circuit of claim 1 further comprising:
    a first analog multiplexer circuit coupled between an output of the amplifier circuit and a gate of a first transistor in the first pull-down circuit; and
    a second analog multiplexer circuit coupled between the output of the amplifier circuit and a gate of a second transistor in the second pull-down circuit.

6. The integrated circuit of claim 5 further comprising:
    a third analog multiplexer circuit coupled to provide one of first or second voltages to a gate of a third transistor in the first pull-up circuit; and
    a fourth analog multiplexer circuit coupled to provide one of the first or second voltages to a gate of a fourth transistor in the second pull-up circuit.

7. The integrated circuit of claim 1, wherein first and second drive signals control first and second transistors in the first pull-up circuit and in the first pull-down circuit, respectively, to drive output signals to the first pad during the voltage mode operation and during the current mode operation.

8. An integrated circuit comprising:
    a first transmitter driver circuit comprising a first pull-up circuit and a first pull-down circuit that are configured as a first voltage mode driver to drive a first single-ended output signal to a first pad during a voltage mode operation;
    a second transmitter driver circuit comprising a second pull-up circuit and a second pull-down circuit that are configured as a second voltage mode driver to drive a second single-ended output signal to a second pad during the voltage mode operation,
    wherein the first and second pull-up circuits and the first and second pull-down circuits drive a differential output signal to the first and second pads during a current mode operation when the first and second transmitter driver circuits are configured as a current mode driver;
    a first analog multiplexer circuit that provides a first constant voltage to a gate of a first transistor in the first pull-up circuit during the voltage mode operation and that provides a second constant voltage to the gate of the first transistor during the current mode operation; and
    a second analog multiplexer circuit that provides the first constant voltage to a gate of a second transistor in the second pull-up circuit during the voltage mode operation and that provides the second constant voltage to the gate of the second transistor during the current mode operation.

9. The integrated circuit of claim 8 further comprising:
a feedback amplifier circuit coupled to the first and second transmitter driver circuits during the current mode operation;
a third analog multiplexer circuit that provides a third constant voltage to a gate of a third transistor in the first pull-down circuit during the voltage mode operation and that provides an output voltage of the feedback amplifier circuit to the gate of the third transistor during the current mode operation; and
a fourth analog multiplexer circuit that provides the third constant voltage to a gate of a fourth transistor in the second pull-down circuit during the voltage mode operation and that provides the output voltage of the feedback amplifier circuit to the gate of the fourth transistor during the current mode operation.

10. An integrated circuit comprising:
a first transmitter driver circuit comprising a first unit slice circuit, wherein the first unit slice circuit comprises a first pull-up circuit and a first pull-down circuit that function as a first voltage mode driver circuit to drive a first single-ended output signal to a first pad during a voltage mode operation;
a second transmitter driver circuit comprising a second unit slice circuit, wherein the second unit slice circuit comprises a second pull-up circuit and a second pull-down circuit that function as a second voltage mode driver circuit to drive a second single-ended output signal to a second pad during the voltage mode operation,
wherein the first pull-up circuit, the first pull-down circuit, the second pull-up circuit, and the second pull-down circuit drive a differential output signal to the first and second pads during a current mode operation when the first and second unit slice circuits are coupled together as a current mode driver circuit;
an amplifier circuit;
a first analog multiplexer circuit coupled between an output of the amplifier circuit and a gate of a first transistor in the first pull-down circuit in the first unit slice circuit; and
a second analog multiplexer circuit coupled between the output of the amplifier circuit and a gate of a second transistor in the second pull-down circuit in the second unit slice circuit.

11. The integrated circuit of claim 10 further comprising:
a differential receiver driver circuit coupled to the first and second pads, wherein the first unit slice circuit in the first transmitter driver circuit and the second unit slice circuit in the second transmitter driver circuit are coupled as termination circuits that provide termination resistance at the first and second pads during a termination mode of operation during which the differential receiver driver circuit buffers a differential input signal received at the first and second pads.

12. The integrated circuit of claim 10 further comprising:
a first switch circuit coupled to the first pad; and
a second switch circuit coupled to the second pad,
wherein an input of the amplifier circuit is coupled to the first and second switch circuits, wherein the first and second switch circuits are open during the voltage mode operation, wherein the first and second switch circuits are closed during the current mode operation to couple together the first and second unit slice circuits, and wherein the amplifier circuit controls currents through the first and second unit slice circuits during the current mode operation.

13. The integrated circuit of claim 12 further comprising:
a third analog multiplexer circuit coupled to a gate of a third transistor in the first pull-up circuit in the first unit slice circuit; and
a fourth analog multiplexer circuit coupled to a gate of a fourth transistor in the second pull-up circuit in the second unit slice circuit.

14. The integrated circuit of claim 10 further comprising:
a third analog multiplexer circuit that provides a first constant voltage to a gate of a third transistor in the first pull-up circuit in the first unit slice circuit during the voltage mode operation and that provides a second constant voltage to the gate of the third transistor during the current mode operation; and
a fourth analog multiplexer circuit that provides the first constant voltage to a gate of a fourth transistor in the second pull-up circuit in the second unit slice circuit during the voltage mode operation and that provides the second constant voltage to the gate of the fourth transistor during the current mode operation.

15. The integrated circuit of claim 14,
wherein the first analog multiplexer circuit provides a third constant voltage to the gate of the first transistor in the first pull-down circuit in the first unit slice circuit during the voltage mode operation and provides an output voltage of the amplifier circuit to the gate of the first transistor during the current mode operation; and
wherein the second analog multiplexer circuit provides the third constant voltage to the gate of the second transistor in the second pull-down circuit in the second unit slice circuit during the voltage mode operation and provides the output voltage of the amplifier circuit to the gate of the second transistor during the current mode operation.

16. A method comprising:
driving a first single-ended output signal to a first pad during a voltage mode operation using a first pull-up circuit and a first pull-down circuit in a first transmitter driver circuit configured as a first voltage mode driver;
driving a second single-ended output signal to a second pad during the voltage mode operation using a second pull-up circuit and a second pull-down circuit in a second transmitter driver circuit configured as a second voltage mode driver;
driving a differential output signal to the first and second pads during a current mode operation using the first pull-up circuit, the first pull-down circuit, the second pull-up circuit, and the second pull-down circuit when the first and second transmitter driver circuits are coupled together as a current mode driver; and
controlling currents through the first pull-down circuit and the second pull-down circuit during the current mode operation using an output voltage of an amplifier circuit that is provided to inputs of the first and second pull-down circuits during the current mode operation.

17. The method of claim 16 further comprising:
buffering a differential input signal received at the first and second pads using a differential receiver driver circuit; and
providing termination resistance at the first and second pads during a termination mode of operation by configuring the first and second pull-up circuits and the first and second pull-down circuits as termination circuits while the differential receiver driver circuit buffers the differential input signal.

18. The method of claim 16 further comprising:

opening first and second switch circuits during the voltage mode operation, wherein the first switch circuit is coupled to the first pad and to the amplifier circuit, and wherein the second switch circuit is coupled to the second pad and to the amplifier circuit; and closing the first and second switch circuits during the current mode operation to couple the first pull-up and first pull-down circuits to the second pull-up and second pull-down circuits and to the amplifier circuit.

19. The method of claim 16 further comprising:

providing a first constant voltage to a gate of a first transistor in the first pull-up circuit during the voltage mode operation using a first analog multiplexer circuit;

providing a second constant voltage to the gate of the first transistor during the current mode operation using the first analog multiplexer circuit;

providing the first constant voltage to a gate of a second transistor in the second pull-up circuit during the voltage mode operation using a second analog multiplexer circuit; and providing the second constant voltage to the gate of the second transistor during the current mode operation using the second analog multiplexer circuit.

20. The method of claim 19 further comprising:

providing a third constant voltage to a gate of a third transistor in the first pull-down circuit during the voltage mode operation using a third analog multiplexer circuit;

providing the output voltage of the amplifier circuit to the gate of the third transistor during the current mode operation using the third analog multiplexer circuit;

providing the third constant voltage to a gate of a fourth transistor in the second pull-down circuit during the voltage mode operation using a fourth analog multiplexer circuit; and providing the output voltage of the amplifier circuit to the gate of the fourth transistor during the current mode operation using the fourth analog multiplexer circuit.

\* \* \* \* \*